(12) United States Patent
Tanaka

(10) Patent No.: US 10,804,483 B2
(45) Date of Patent: Oct. 13, 2020

(54) ORGANIC ELECTROLUMINESCENT ELEMENT WITH A PLURALITY OF STACKED LIGHT EMITTING UNITS

(71) Applicant: LUMIOTEC INC., Yonezawa-shi, Yamagata (JP)

(72) Inventor: Junichi Tanaka, Yonezawa (JP)

(73) Assignee: LUMIOTEC INC., Yonezawa-shi (JP)

(*) Notice: Subject to any disclaimer, the term of this patent is extended or adjusted under 35 U.S.C. 154(b) by 0 days.

(21) Appl. No.: 16/468,950

(22) PCT Filed: Dec. 27, 2017

(86) PCT No.: PCT/JP2017/047101
§ 371 (c)(1),
(2) Date: Jun. 12, 2019

(87) PCT Pub. No.: WO2018/124237
PCT Pub. Date: Jul. 5, 2018

(65) Prior Publication Data
US 2020/0083472 A1    Mar. 12, 2020

(30) Foreign Application Priority Data
Dec. 27, 2016  (JP) ................. 2016-254340

(51) Int. Cl.
*H01L 29/08*    (2006.01)
*H01L 33/00*    (2010.01)
(Continued)

(52) U.S. Cl.
CPC ........ *H01L 51/5044* (2013.01); *H01L 33/502* (2013.01); *H01L 33/504* (2013.01);
(Continued)

(58) Field of Classification Search
CPC .. H01L 51/5044; H01L 33/502; H01L 33/504
See application file for complete search history.

(56) References Cited

U.S. PATENT DOCUMENTS 7,142,179 B2 * 11/2006 Miller .................. G09G 3/3233
345/76
8,896,197 B2 * 11/2014 Negley .................. H05B 45/20
313/501
(Continued)

FOREIGN PATENT DOCUMENTS

JP    2003-2728602 A    10/2002
JP    2003-272860 A     9/2003
(Continued)

OTHER PUBLICATIONS

International Search Report for PCT/JP2017/047101 (PCT/ISA/210) dated Apr. 3, 2018, with English translation.

*Primary Examiner* — Alonzo Chambliss
(74) *Attorney, Agent, or Firm* — Birch, Stewart, Kolasch & Birch, LLP

(57) ABSTRACT

This organic electroluminescent element has a structure in which, between a first electrode and a second electrode, a plurality of light-emitting units are layered with a charge generation layer 14 interposed therebetween, and comprises a red light-emitting unit and a green light-emitting unit. In the organic electroluminescent element, yellow or orange light obtained by light emission from the two light-emitting units has a peak wavelength in each of a red wavelength range of 590-640 nm and a green wavelength range of 500-560 nm, and the difference between the peak wavelength of the yellow or orange light and the dominant wavelength of the yellow or orange light is 15-25 nm.

17 Claims, 5 Drawing Sheets

(51) Int. Cl.
- *H01L 31/0232* (2014.01)
- *H01L 51/40* (2006.01)
- *H01L 51/50* (2006.01)
- *H01L 33/50* (2010.01)
- *H01L 51/00* (2006.01)

(52) U.S. Cl.
CPC ...... *H01L 51/0072* (2013.01); *H01L 51/0097* (2013.01); *H01L 51/5016* (2013.01); *H01L 2251/5307* (2013.01); *H01L 2251/5369* (2013.01); *H01L 2251/554* (2013.01)

(56) References Cited

U.S. PATENT DOCUMENTS

| | | |
|---|---|---|
| 2003/0189401 A1 | 10/2003 | Kido et al. |
| 2006/0087225 A1 | 4/2006 | Liao et al. |
| 2013/0320837 A1 | 12/2013 | Weaver et al. |
| 2015/0155511 A1 | 6/2015 | Ohsawa et al. |
| 2015/0252963 A1 | 9/2015 | Stoll et al. |
| 2016/0004005 A1 | 1/2016 | Namekata et al. |
| 2016/0064623 A1* | 3/2016 | Clatterbuck ....... C09K 11/7774 257/98 |
| 2016/0181560 A1 | 6/2016 | Yamamoto et al. |
| 2016/0343953 A1 | 11/2016 | Kuwabara et al. |
| 2019/0148676 A1 | 5/2019 | Morimoto et al. |

FOREIGN PATENT DOCUMENTS

| | | |
|---|---|---|
| JP | 2008-518400 A | 5/2008 |
| JP | 2014-187310 A | 10/2014 |
| JP | 2015-032367 A | 2/2015 |
| JP | 2015-134874 A | 7/2015 |
| JP | 2015-532501 A | 11/2015 |
| JP | 2016-027546 A | 2/2016 |
| JP | 2016-054138 A | 4/2016 |
| JP | 2016-066542 A | 4/2016 |
| JP | 5991686 B1 | 9/2016 |
| WO | WO 2006/047170 A1 | 5/2006 |
| WO | WO 2014/048682 A1 | 4/2014 |
| WO | WO 2015/083025 A1 | 6/2015 |
| WO | WO 2015/108049 A1 | 7/2015 |
| WO | WO 2017/179692 A1 | 10/2017 |

\* cited by examiner

ORGANIC ELECTROLUMINESCENT ELEMENT WITH A PLURALITY OF STACKED LIGHT EMITTING UNITS

TECHNICAL FIELD

The present invention relates to an organic electroluminescent element and a lighting device including the same.

The present application claims the benefit of priority of Japanese Patent Application No. 2016-254340 filed on Dec. 27, 2016, the contents of which are incorporated herein by reference.

BACKGROUND ART

An organic electroluminescent element (hereafter, also referred to as "organic EL element" for short) is a self-luminescent element including a light emitting layer, made of an organic compound, between a cathode and an anode facing each other. When voltage is applied between the cathode and the anode, electrons injected into the light emitting layer from the cathode side and holes injected into the light emitting layer from the anode side recombine in the light emitting layer to form excitons and the excitons causes the organic EL element to emit light.

As an organic EL element capable of achieving high luminance and long life, there is known an element with a multi-photon emission structure (hereafter, referred to as "MPE element" for short) in which a light emitting unit including at least one light emitting layer is considered as one unit and an electrically-insulating charge generating layer is arranged between multiple light emitting units (for example, see Patent Document 1). In the MPE element, when voltage is applied between a cathode and an anode, charges in a charge transfer complex move to the cathode side and the anode side. In the MPE element, holes are thereby injected into one light emitting unit located on the cathode side of the charge generating layer and electrons are injected into another light emitting unit located on the anode side of the charge generating layer. In such an MPE element, since light can be simultaneously emitted from the multiple light emitting units with the same current amount, a current efficiency and an external quantum efficiency multiplied by the number of the light emitting units can be achieved.

The MPE element can provide white light of various color temperatures by combining light emitting units which emit light of different colors. High efficiency is easier to achieve in an MPE element which emits white light of a warm color than in MPE elements which emit white light of other colors. In the white light of warm color, optimization of red light which is the main component of the white light leads to an increase in the efficiency of white light. The special color rendering index R9 indicating reproducibility of red is known to be used as an index for achieving such optimization of the red light (see, for example, Patent Document 2).

However, for color light other than the white light such as red and yellow light, the special color rendering index R9 cannot be used as the index for achieving optimization of the color light which leads to an increase in the efficiency.

PRIOR ART DOCUMENT

Patent Document

Patent Document 1: Japanese Patent Application Publication No. 2003-272860
Patent Document 2: Japanese Patent Application Publication No. 2016-66542

SUMMARY OF THE INVENTION

Problems to be Solved by the Invention

The present invention has been proposed in view of the aforementioned conventional circumstances and an object thereof is to provide an organic electroluminescent element which emits color light other than white light with high luminous efficiency and which is suitable for a special lighting device such as an automobile lighting device and to provide a lighting device including this organic electroluminescent element.

Means for Solving the Problems

To achieve the above object, the following aspects are provided.
(1) An organic electroluminescent element having a structure in which a plurality of light emitting units each including a light emitting layer made of at least an organic compound are stacked one on top of another between a first electrode and a second electrode with a charge generating layer sandwiched between the light emitting units, the organic electroluminescent element comprising:
a red light emitting unit including a light emitting layer formed of a red light emitting layer which emits red light with a peak wavelength in a red wavelength band; and
a green light emitting unit including a light emitting layer formed of a green light emitting layer which emits green light with a peak wavelength in a green wavelength band, wherein
yellow or orange light produced by light emission of the red light emitting unit and the green light emitting unit has a peak wavelength in a red wavelength band of 590 nm to 640 nm and a peak wavelength in a green wavelength band of 500 nm to 560 nm, and
a difference between the peak wavelength of the yellow or orange light and a dominant wavelength of the yellow or orange light is 15 nm to 25 nm.
(2) The organic electroluminescent element according to the above aspect (1), wherein
the red light emitting layer has one peak wavelength in the red wavelength band,
the green light emitting layer has one or two peak wavelengths in the green wavelength band, and
the yellow or orange light produced by the light emission of the red light emitting unit and the green light emitting unit has one peak wavelength in the red wavelength band of 590 nm to 640 nm and has one or two peak wavelength in the green wavelength band of 500 nm to 560 nm.
(3) The organic electroluminescent element according to the above aspect (1) or (2), wherein the red light emitting layer is formed of a red light emitting layer containing a red fluorescent material or a red phosphorescent material.
(4) The organic electroluminescent element according to the above aspect (3), wherein the red light provided by the light emitting unit including the red light emitting layer includes a delayed fluorescence component.

(5) The organic electroluminescent element according to the above aspect (1) or (2), wherein the green light emitting layer is formed of a green light emitting layer containing a green fluorescent material or a green phosphorescent material.

(6) The organic electroluminescent element according to the above aspect (5), wherein the green light provided by the light emitting unit including the green light emitting layer includes a delayed fluorescence component.

(7) The organic electroluminescent element according to any one of the above aspects (1) to (6), the organic electroluminescent element having a structure in which a plurality of light emitting units each including a light emitting layer made of at least an organic compound are stacked one on top of the other between the first electrode and the second electrode with a charge generating layer sandwiched between the light emitting units, the organic electroluminescent element capable of providing yellow or orange light by causing the plurality of light emitting units to emit light, the organic electroluminescent element comprising:

a first light emitting unit formed of the red light emitting unit; and a second light emitting unit formed of the green light emitting unit, wherein the first light emitting unit and the second light emitting unit are stacked one on top of the other with a first charge generating layer sandwiched therebetween, and the organic electroluminescent element has a structure in which the second electrode, the second light emitting unit, the first charge generating layer, the first light emitting unit, and the first electrode are stacked one on top of another in this order.

(8) The organic electroluminescent element according to any one of the above aspects (1) to (6), the organic electroluminescent element having a structure in which a plurality of light emitting units each including a light emitting layer made of at least an organic compound are stacked one on top of the other between the first electrode and the second electrode with a charge generating layer sandwiched between the light emitting units, the organic electroluminescent element capable of providing yellow or orange light by causing the plurality of light emitting units to emit light, the organic electroluminescent element comprising:

a first light emitting unit formed of the green light emitting unit; and a second light emitting unit formed of the red light emitting unit, wherein the first light emitting unit and the second light emitting unit are stacked one on top of the other with a first charge generating layer sandwiched therebetween, and the organic electroluminescent element has a structure in which the second electrode, the second light emitting unit, the first charge generating layer, the first light emitting unit, and the first electrode are stacked one on top of another in this order.

(9) The organic electroluminescent element according to any one of the above aspects (1) to (6), the organic electroluminescent element having a structure in which a plurality of light emitting units each including a light emitting layer made of at least ab organic compound are stacked one on top of another between the first electrode and the second electrode with a charge generating layer sandwiched between each pair of the adjacent light emitting units, the organic electroluminescent element capable of providing yellow or orange light by causing the plurality of light emitting units to emit light, the organic electroluminescent element comprising:

a first light emitting unit formed of the red light emitting unit;

a second light emitting unit formed of the green light emitting unit; and a third light emitting unit formed of the red light emitting unit, wherein the first light emitting unit and the second light emitting unit are stacked one on top of the other with a first charge generating layer sandwiched therebetween, the second light emitting unit and the third light emitting unit are stacked one on top of the other with a second charge generating layer sandwiched therebetween, and the organic electroluminescent element has a structure in which the second electrode, the third light emitting unit, the second charge generating layer, the second light emitting unit, the first charge generating layer, the first light emitting unit, and the first electrode are stacked one on top of another in this order.

(10) The organic electroluminescent element according to any one of the above aspects (1) to (9), wherein the charge generating layer is formed of an electrically insulating layer made of an electron accepting material and an electron donating material, and a specific resistance of the electrically insulating layer is $1.0 \times 10^2 \Omega \cdot cm$ or more.

(11) The organic electroluminescent element according to the above aspect (10), wherein the specific resistance of the electrically insulating layer is $1.0 \times 10^5 \Omega \cdot cm$ or more.

(12) The organic electroluminescent element according to any one of the above aspects (1) to (11), characterized in that the charge generating layer is formed of a mixed layer of different materials and one component of the mixed layer forms a charge transfer complex by redox, and when voltage is applied between the first electrode and the second electrode, charges in the charge transfer complex move to the first electrode side and the second electrode side to cause holes to be injected into one light emitting unit located on the first electrode side of the charge generating layer and cause electrons to be injected into another light emitting unit located on the second electrode side of the charge generating layer.

(13) The organic electroluminescent element according to any one of the above aspects (1) to (12), characterized in that the charge generating layer is formed of a laminate of an electron accepting material and an electron donating material, and when voltage is applied between the first electrode and the second electrode, in an interface between the electron accepting material and the electron donating material, charges generated by reaction involving electron transfer between the electron accepting material and the electron donating material move to the first electrode side and the second electrode side to cause holes to be injected into one light emitting unit located on the first electrode side of the charge generating layer and cause electrons to be injected into another light emitting unit located on the second electrode side of the charge generating layer.

(14) The organic electroluminescent element according to any one of the above aspects (1) to (13), wherein the charge generating layer contains a compound having a structure expressed by formula (1):

[Chem. 1]

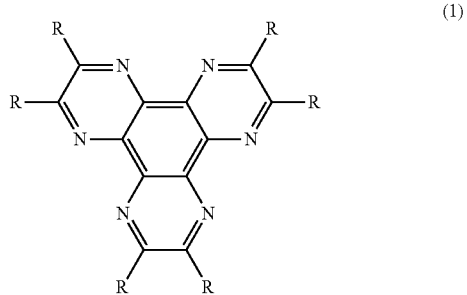

(1)

where R represents an electron withdrawing group of F, Cl, Br, I, CN, or $CF_3$.

(15) A lighting device comprising the organic electroluminescent element according to any one of the above aspects (1) to (14).
(16) The lighting device according to the above aspect (15), comprising an optical film on a light extraction surface side of the organic electroluminescent element.
(17) The lighting device according to the above aspect (16), comprising a base substrate and a sealing substrate which are formed of flexible substrates, wherein
the lighting device is flexible.

Effect of the Invention

According to the one aspect described above, it is possible to provide an organic electroluminescent element which emits color light other than white light with high luminous efficiency and which is suitable for a special lighting device such as an automobile lighting device and to provide a lighting device including this organic electroluminescent element.

MODE FOR CARRYING OUT THE INVENTION

Figure 1:
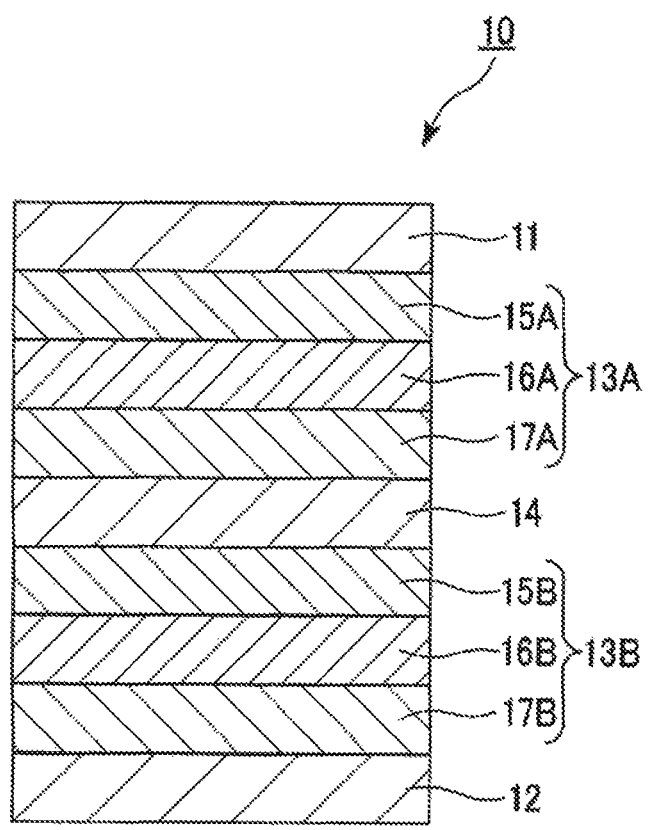
FIG. 1 is a cross-sectional view illustrating a schematic configuration of an organic EL element according to a first embodiment of the present invention.

Detailed description is given of embodiments of an organic electroluminescent element of the present invention and a lighting device including the same with reference to the drawings.

Note that, for the sake of convenience, in the drawings used in the following description, characteristic parts are sometimes illustrated in an enlarged manner to facilitate understanding of characteristics, and proportions of dimensions of constitutional elements and the like are not always the same as actual ones. Moreover, materials, dimensions, and the like exemplified in the following description are merely examples and the present invention are not necessarily limited to those and can be carried out with the materials, dimensions, and the like appropriately changed within a scope not changing the spirit of the invention.

First Embodiment

"Organic Electroluminescent Element (Organic EL Element)"

FIG. 1 is a cross-sectional view illustrating a schematic configuration of an organic EL element according to a first embodiment of the present invention.

As illustrated in FIG. 1, the organic EL element 10 of the embodiment has a structure in which multiple light emitting units 13A, 13B each including a light emitting layer made of at least an organic compound are stacked one on top of the other between a first electrode 11 and a second electrode 12 with a charge generating layer (CGL) 14 sandwiched between the light emitting units 13A, 13B. The organic EL element 10 is an organic EL element capable of providing yellow or orange light by causing the multiple light emitting units 13A, 13B to emit light.

The organic EL element 10 of the embodiment includes the first light emitting unit 13A and the second light emitting unit 13B.

The first light emitting unit 13A is a red light emitting unit. The second light emitting unit 13B is a green light emitting unit.

The red light emitting unit includes a light emitting layer formed of a red light emitting layer which emits red light with one peak wavelength in a red wavelength band. The red light provided by the red light emitting unit including the light emitting layer formed of the red light emitting layer may include a delayed fluorescence component. Moreover, the green light emitting unit includes a light emitting layer formed of a green light emitting layer which emits green light with one or two peak wavelengths in a green wavelength band. The green light provided by the green light emitting unit including the light emitting layer formed of the green light emitting layer may include a delayed fluorescence component.

The first light emitting unit 13A and the second light emitting unit 13B are stacked one on top of the other with the charge generating layer 14 sandwiched therebetween.

The organic EL element 10 of the embodiment has a structure in which the second electrode 12, the second light emitting unit 13B, the charge generating layer 14, the first light emitting unit 13A, and the first electrode 11 are stacked one on top of another in this order. Specifically, the organic EL element 10 of the embodiment has an MPE structure in which the first light emitting unit 13A and the second light emitting unit 13B are stacked one on top of the other with the charge generating layer 14 sandwiched between the light emitting units 13A, 13B.

In the organic EL element 10 of the embodiment, the yellow or orange light produced by the light emission of the first light emitting unit 13A and the second light emitting unit 13B has one peak wavelength in a red wavelength band of 590 nm to 640 nm and one or two peak wavelengths in a green wavelength band of 500 nm to 560 nm.

In the organic EL element 10 of the embodiment, a difference between a peak wavelength of the yellow or orange light and a dominant wavelength of the yellow or orange light is 15 nm to 25 nm.

When the difference between the peak wavelength of the yellow or orange light and the dominant wavelength of the yellow or orange light is 15 nm to 25 nm, the organic EL element 10 can efficiently provide the color light (red light) of the first light emitting unit 13A and the color light (green light) of the second light emitting unit 13B. Accordingly, the organic EL element 10 can provide color light suitable as illumination light with high luminous efficiency.

When the difference between the peak wavelength of the yellow or orange light and the dominant wavelength of the yellow or orange light is less than 15 nm, a peak wavelength not included in an original light emission component (red light component or green light component) is emphasized by an interference effect and the luminous efficiency decreases. Meanwhile, when the difference between the peak wavelength of the yellow or orange light and the dominant wavelength of the yellow or orange light is greater than 25 nm, the red light and the green light which are main components of the color light cannot be provided in a sufficient intensity and the color light thus has poor color as illumination light.

The dominant wavelength is a quantified value of the color (single wavelength) perceived by the human eye. The sensitivity of the human eye to light is dependent on the wavelength, and the peak wavelength at which the light emission intensity is highest is different from the wavelength actually perceived by the human eye.

A chromaticity diagram is a diagram in which values (chromaticity) of x and y are expressed on an orthogonal coordinate system. When x and y of various types of monochromatic light in the spectrum are calculated over the entire visible wavelength band and the coordinates of x and y are plotted, a horseshoe-shaped curve with a straight line extending from violet to red of the chromaticity diagram is obtained. This curve is referred to as spectrum locus. Moreover, a corner of violet in this curve corresponds to wavelength of 380 nm and a corner of red corresponds to 780 nm.

The dominant wavelength is measured as follows.

In the chromaticity diagram, a straight line is drawn from a chromatic point of white (x=y=0.33) to a point (chromatic point) where the chromaticity of the light (yellow or orange light in this case) emitted by the organic EL element 10 is plotted. A monochromatic light wavelength of a point where the drawn straight line and the spectrum locus intersect is determined as the dominant wavelength.

The external quantum efficiency is a ratio obtained by dividing the number of photons extracted to the outside by the number of carriers injected into the inside of the element and can be used as an index of luminous efficiency.

Generally, a metal with a small work function, an alloy of such a metal, a metal oxide, or the like is preferably used as the first electrode 11. For example, as a metal forming the first electrode 11, it is possible to use a metal single substance like an alkaline metal such as lithium (Li), an alkaline earth metal such as magnesium (Mg) or calcium (Ca), or a rare-earth metal such as europium (Eu) or use an alloy containing any of these metals and aluminum (Al), silver (Ag), indium (In), or the like.

Alternatively, the first electrode 11 may have a configuration in which an organic layer doped with a metal is used in an interface between the first electrode 11 and an organic layer as described in, for example, "Japanese Patent Application Publication No. Hei 10-270171" and "Japanese Patent Application Publication No. 2001-102175." In this case, it is only necessary to use an electrically conductive material as the material of the first electrode 11 and the material is not limited to one with particular properties such as the work function.

As another alternative, the first electrode 11 may have a configuration in which an organic layer in contact with the first electrode 11 is made of an organic metal complex compound containing at least one type selected from the group consisting of alkali metal ions, alkaline earth metal ions, and rare-earth metal ions as described in, for example, "Japanese Patent Application Publication No. Hei 11-233262" and "Japanese Patent Application Publication No. 2000-182774." In this case, a metal capable of reducing the metal ions contained in the organic metal complex compound to metal in vacuum, for example, a metal (with a thermal reduction property) such as aluminum (Al), zirconium (Zr), titanium (Ti), and silicon (Si) or an alloy containing any of these metals can be used as the first electrode 11. Among these, Al which is generally widely used as a wiring electrode is particularly preferable from the viewpoint of ease of vapor deposition, high light reflectance, chemical stability, and the like.

The material of the second electrode 12 is not limited to a particular material. When light is to be extracted from the second electrode 12 side, a transparent, electrically conductive material such as, for example, ITO (Indium Tin Oxide) or IZO (Indium Zinc Oxide) can be used.

Moreover, in contrary to a general organic EL element, light can be extracted from the first electrode 11 side by using a metal material or the like for the second electrode 12 and using a transparent, electrically conductive material for the first electrode 11. For example, by employing the method described in "Japanese Patent Application Publication No. 2002-332567," the first electrode 11 made of the aforementioned transparent, electrically conductive material such as ITO and IZO can be formed by sputtering which does not damage an organic film.

Accordingly, when both of the first electrode 11 and the second electrode 12 are formed to be transparent, since the first light emitting unit 13A and the second light emitting unit 13B are also similarly transparent, it is possible to manufacture a transparent organic EL element 10.

Note that the order of film formation does not have to start from the second electrode 12 side and may start from the first electrode 11 side.

The first light emitting unit 13A is formed of a first electron transport layer 15A, a first light emitting layer 16A, and a first hole transport layer 17A. Moreover, the second light emitting unit 13B is formed of a second electron transport layer 15B, a second light emitting layer 16B, and a second hole transport layer 17B.

The first light emitting unit 13A and the second light emitting unit 13B may employ any of various structures similar to those of conventionally-known organic EL elements and may have any laminated structure as long as they include light emitting layers made of at least an organic compound. For example, each of the first light emitting unit 13A and the second light emitting unit 13B may be configured such that an electron injection layer, a hole blocking layer, and the like are arranged on the first electrode 11 side of the light emitting layer and a hole injection layer, an electron blocking layer, and the like are arranged on the second electrode 12 side of the light emitting layer.

The first electron transport layer 15A and the second electron transport layer 15B are each made of, for example, a conventionally well-known electron transport material. In the organic EL element 10 of the embodiment, an electron transport material with a relatively deep HOMO (Highest Occupied Molecular Orbital) level is preferably used among electron transport materials generally used for organic EL elements. Specifically, an electron transport material with a HOMO level of at least about 6.0 eV is preferably used. For example, 4,7-Diphenyl-1,10-phenanthroline (Bphen), 2,2', 2"-(1,3,5-Benzinetriyl)-tris(1-phenyl-1-H-benzimidazol e) (TPBi), and the like can be used as such an electron transport material.

Moreover, each of the first electron transport layer 15A and the second electron transport layer 15B may be formed of one layer or two or more layers.

The electron injection layers are provided between the first electrode 11 and the first electron transport layer 15A and between the charge generating layer 14 and the second electron transport layer 15B to improve injection efficiency of electrons from at least one of the first electrode 11 and the charge generating layer 14. An electron transport material having properties similar to the electron transport layers can be used as the material of the electron injection layers. The electron transport layers and the electron injection layers are sometimes collectively referred to as electron transport layers.

The first hole transport layer 17A and the second hole transport layer 18B are each made of, for example, a conventionally well-known hole transport material. The hole transport material is not limited to a particular material. For example, an organic compound (electron donating material) which has an ionization potential less than 5.7 eV and which has a hole transport property, that is an electron donating property is preferably used as the hole transport material. For example, an arylamine compound such as 4,4'-bis-[N-(2-naphthyl)-N-phenyl-amino]biphenyl (α-NPD) or the like can be used as the electron donating material.

The hole injection layers are provided between the second electrode 12 and the second hole transport layer 17B and between the charge generating layer 14 and the first hole transport layer 17A to improve injection efficiency of holes from at least one of the second electrode 12 and the charge generating layer 14. An electron donating material having properties similar to the hole transport layers can be used as the material of the hole injection layers. The hole transport layers and the hole injection layers are sometimes collectively referred to as hole transport layers.

The first light emitting layer 16A included in the first light emitting unit 13A is made of the red light emitting layer containing a red fluorescent material or a red phosphorescent material.

The second light emitting layer 16B included in the second light emitting unit 13B is made of the green light emitting layer containing a green fluorescent material or a green phosphorescent material.

The red light emitting layer and the green light emitting layer each contain a host material which is a main component and a guest material which is a minor component as the organic compound. Emission of the red light and the green light is attributable particularly to the properties of the guest material.

As the host material of the light emitting layers included in the first light emitting unit 13A and the second light emitting unit 13B, a material with an electron transport property, a material with a hole transport property, a material obtained by mixing these materials, or the like can be used.

The guest material of the light emitting layers included in the first light emitting unit 13A and the second light emitting unit 13B is also referred to as dopant material. The guest material utilizing fluorescent light emission is generally referred to as fluorescent light emitting material. A light emitting layer made of the fluorescent light emitting material is referred to as fluorescent light emitting layer. Meanwhile, the guest material utilizing phosphorescent light emission is generally referred to as phosphorescent light emitting material. A light emitting layer made of the phosphorescent light emitting material is referred to as phosphorescent light emitting layer.

In the phosphorescent light emitting layer out of these layers, it is possible to utilize not only 75% of triplet excitons, which are generated by recombination of electrons and holes, but also 25% of the triplet excitons, which are generated by energy transfer from singlet excitons. Accordingly, an internal quantum efficiency of 100% can be achieved in theory. Specifically, the excitons generated by the recombination of electrons and holes are converted to light in the light emitting layer without thermal quenching or the like. In an organic metal complex including heavy atoms such as iridium or platinum, an internal quantum efficiency close to 100% is actually achieved by optimization of the element structure and the like.

As the guest material of the red fluorescent light emitting layer, a material such as DCJTB can be used. Moreover, as the guest material of the red phosphorescent light emitting layer, a red phosphorescent light emitting material such as $Ir(piq)_3$ or $Ir(btpy)_3$ can be used.

As the guest material of the green fluorescent light emitting layer, a material such as coumarin 6 can be used. Moreover, as the guest material of the green phosphorescent light emitting layer, a green phosphorescent light emitting material such as $Ir(ppy)_3$ can be used.

As the host material of the red fluorescent light emitting layer, for example, 4,4'-Bis(2,2-diphenylvinyl)-1,1'-biphenyl (DPVBi), Tris(8-hydroxyquinolinato)aluminum ($Alq_3$), or the like can be used. Moreover, as the host material of the red phosphorescent light emitting layer, for example, a red phosphorescent light emitting material such as 4,4'-biscarbazolylbiphenyl (CBP) or 2,9-dimethyl-4,7-diphenyl-9,10-phenanthroline (BCP) can be used.

As the host material of the green fluorescent light emitting layer, for example, 4,4'-Bis(2,2-diphenylvinyl)-1,1'-biphenyl (DPVBi), Tris(8-hydroxyquinolinato)aluminum ($Alq_3$), or the like can be used. Moreover, as the host material of the green phosphorescent light emitting layer, for example, a green phosphorescent light emitting material such as 4,4'-biscarbazolylbiphenyl (CBP) or 2,9-dimethyl-4,7-diphenyl-9,10-phenanthroline (BCP) can be used.

For example, a vacuum deposition method, a spin coating method, or the like can be used as a film forming method of the layers forming the first light emitting unit 13A and the second light emitting unit 13B.

The charge generating layer 14 is formed of an electrically insulating layer made of an electron accepting material and an electron donating material. The specific resistance of the electrically insulating layer is preferably $1.0 \times 10^2 \Omega \cdot cm$ or more, more preferably $1.0 \times 10^5 \Omega \cdot cm$ or more.

Alternatively, the charge generating layer 14 may be configured such that the charge generating layer 14 is formed of a mixed layer of different materials and one component of the mixed layer forms a charge transfer complex by redox. In this case, when voltage is applied between the first electrode 11 and the second electrode 12, charges in the charge transfer complex move to the first electrode 11 side and the second electrode 12 side. In the organic EL element 10, holes are thereby injected into the first light emitting unit 13A located on the first electrode 11 side of the charge generating layer 14 and electrons are injected into the second light emitting unit 13B located on the second electrode 12 side of the charge generating layer 14. Light can be thereby simultaneously emitted from the first light emitting unit 13A and the second light emitting unit 13B with the same current amount. Accordingly, a current efficiency and an external quantum efficiency proportionate to the sum of luminous efficiencies of the first light emitting unit 13A and the second light emitting unit 13B can be obtained.

Alternatively, the charge generating layer 14 may be a laminate of an electron accepting material and an electron donating material. In this case, when voltage is applied between the first electrode 11 and the second electrode 12, in an interface between the electron accepting material and the electron donating material, charges generated by reaction involving electron transfer between these electron accepting material and electron donating material move to the first electrode 11 side and the second electrode 12 side. In the organic EL element 10, holes are thereby injected into the first light emitting unit 13A located on the first electrode 11 side of the charge generating layer 14 and electrons are injected into the second light emitting unit 13B located on the second electrode 12 side of the charge generating layer 14. Light can be thereby simultaneously emitted from the first light emitting unit 13A and the second light emitting unit 13B with the same current amount. Accordingly, a current efficiency and an external quantum efficiency proportionate to the sum of luminous efficiencies of the first light emitting unit 13A and the second light emitting unit 13B can be obtained.

For example, materials described in Japanese Patent Application Publication No. 2003-272860 can be used as materials forming the charge generating layer 14. Among these, materials described in paragraphs [0019] to [0021] can be preferably used. Alternatively, materials described in paragraphs [0023] to [0026] of "International Patent Application Publication No. WO2010/113493" can be used as materials forming the charge generating layer 14. Among these, a strong electron accepting material (HATCN6) described in paragraphs [0059] in particular can be preferably used. When substituent groups represented by R in the structure expressed by the following formula (1) are CN (cyano groups), this compound is HATCN6 described above.

[Chem. 2]

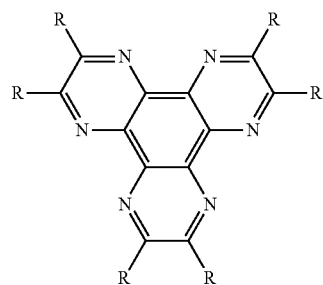

(1)

where R represents an electron withdrawing group of F, Cl, Br, I, CN, or $CF_3$

As described above, in the organic EL element 10 of the embodiment, since the difference between the peak wavelength of the yellow or orange light and the dominant wavelength of the yellow or orange light is 15 nm to 25 nm, the organic EL element 10 can provide orange light with high luminous efficiency. Moreover, the organic EL element 10 of the embodiment has the MPE structure in which the first light emitting unit 13A and the second light emitting unit 13B are stacked one on top of the other with the charge generating layer 14 sandwiched between the light emitting units 13A, 13B. Accordingly, the organic EL element 10 can provide yellow light or orange light while achieving high-luminance light emission and long-life driving.

The organic EL element 10 of the embodiment can be thereby preferably used in a special lighting device such as an automobile lighting device.

Second Embodiment

"Organic EL Element"

Figure 2:
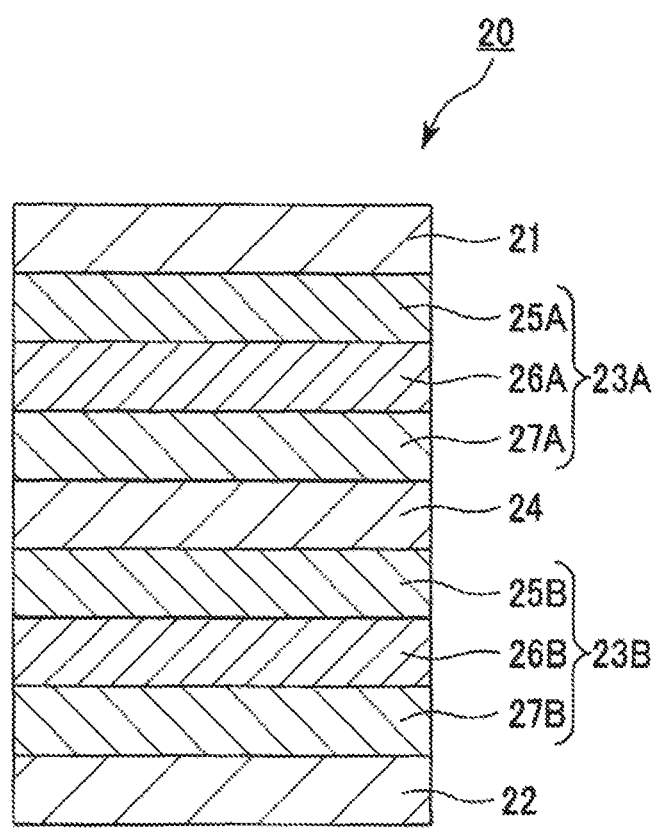
FIG. 2 is a cross-sectional view illustrating a schematic configuration of an organic EL element according to a second embodiment of the present invention.

FIG. 2 is a cross-sectional view illustrating a schematic configuration of an organic EL element according to a second embodiment of the present invention.

As illustrated in FIG. 2, the organic EL element 20 of the embodiment has a structure in which multiple light emitting units 23A, 23B each including a light emitting layer made of at least an organic compound are stacked one on top of the other between a first electrode 21 and a second electrode 22 with a charge generating layer (CGL) 24 sandwiched between the light emitting units 23A, 23B. The organic EL element 20 is an organic EL element capable of providing yellow or orange light by causing the multiple light emitting units 23A, 23B to emit light.

The organic EL element 20 of the embodiment includes the first light emitting unit 23A and the second light emitting unit 23B.

The first light emitting unit 23A is a green light emitting unit. The second light emitting unit 23B is a red light emitting unit.

The red light emitting unit includes a light emitting layer formed of a red light emitting layer which emits red light with one peak wavelength in a red wavelength band. The red light provided by the red light emitting unit including the light emitting layer formed of the red light emitting layer may include a delayed fluorescence component. Moreover, the green light emitting unit includes a light emitting layer formed of a green light emitting layer which emits green light with one or two peak wavelength in a green wavelength band. The green light provided by the green light emitting unit including the light emitting layer formed of the green light emitting layer may include a delayed fluorescence component.

The first light emitting unit 23A and the second light emitting unit 23B are stacked one on top of the other with the charge generating layer 24 sandwiched therebetween.

The organic EL element 20 of the embodiment has a structure in which the second electrode 22, the second light emitting unit 23B, the charge generating layer 24, the first light emitting unit 23A, and the first electrode 21 are stacked one on top of another in this order. Specifically, the organic EL element 20 of the embodiment has an MPE structure in which the first light emitting unit 23A and the second light emitting unit 23B are stacked one on top of the other with the charge generating layer 24 sandwiched therebetween.

In the organic EL element 20 of the embodiment, the yellow or orange light produced by the light emission of the first light emitting unit 13A and the second light emitting unit 13B has one peak wavelength in a red wavelength band of 590 nm to 640 nm and one or two peak wavelengths in a green wavelength band of 500 nm to 560 nm.

In the organic EL element 20 of the embodiment, a difference between a peak wavelength of the yellow or orange light and a dominant wavelength of the yellow or orange light is 15 nm to 25 nm.

When the difference between the peak wavelength of the yellow or orange light and the dominant wavelength of the yellow or orange light is 15 nm to 25 nm, the organic EL element 20 can efficiently provide the color light (green light) of the first light emitting unit 23A and the color light (red light) of the second light emitting unit 23B. Accordingly, the organic EL element 20 can provide color light suitable as illumination light with high luminous efficiency. Moreover, the external quantum efficiency of the organic EL element 20 is improved.

When the difference between the peak wavelength of the yellow or orange light and the dominant wavelength of the yellow or orange light is less than 15 nm, a peak wavelength not included in an original light emission component (red light component or green light component) is emphasized by an interference effect and the luminous efficiency decreases. Meanwhile, when the difference between the peak wavelength of the yellow or orange light and the dominant wavelength of the yellow or orange light is greater than 25 nm, the red light and the green light which are main components of the color light cannot be provided in a sufficient intensity and the color light thus has poor color as illumination light.

The same electrode as the first electrode 11 in the aforementioned first embodiment can be used as the first electrode 21.

The same electrode as the second electrode 12 in the aforementioned first embodiment can be used as the second electrode 22.

The first light emitting unit 23A is formed of a first electron transport layer 25A, a first light emitting layer 26A, and a first hole transport layer 27A. The second light emitting unit 23B is formed of a second electron transport layer 25B, a second light emitting layer 26B, and a second hole transport layer 27B.

As the first light emitting unit 23A, the same unit as the second light emitting unit 13B in the aforementioned first embodiment can be used.

As the second light emitting unit 23B, the same unit as the first light emitting unit 13A in the aforementioned first embodiment can be used.

The first electron transport layer 25A and the second electron transport layer 25B have the same configuration as that of the electron transport layer 14 in the aforementioned first embodiment.

The first hole transport layer 27A and the second hole transport layer 27B have the same configuration as that of the hole transport layer 16 in the aforementioned first embodiment.

As the charge generating layer 24, the same layer as the charge generating layer 14 in the aforementioned first embodiment can be used.

As described above, in the organic EL element 20 of the embodiment, the difference between the peak wavelength of the yellow or orange light and the dominant wavelength of the yellow or orange light is 15 nm to 25 nm. Accordingly, the organic EL element 20 can provide the yellow or orange light with high luminous efficiency. Moreover, the organic EL element 20 of the embodiment has the MPE structure in which the first light emitting unit 23A and the second light emitting unit 23B are stacked one on top of the other with the charge generating layer 24 sandwiched between the light emitting units 23A, 23B. Accordingly, the organic EL element 20 can provide yellow or orange light while achieving high-luminance light emission and long-life driving.

The organic EL element 20 of the embodiment can be thereby preferably used in a special lighting device such as an automobile lighting device.

Third Embodiment

"Organic EL Element"

Figure 3:
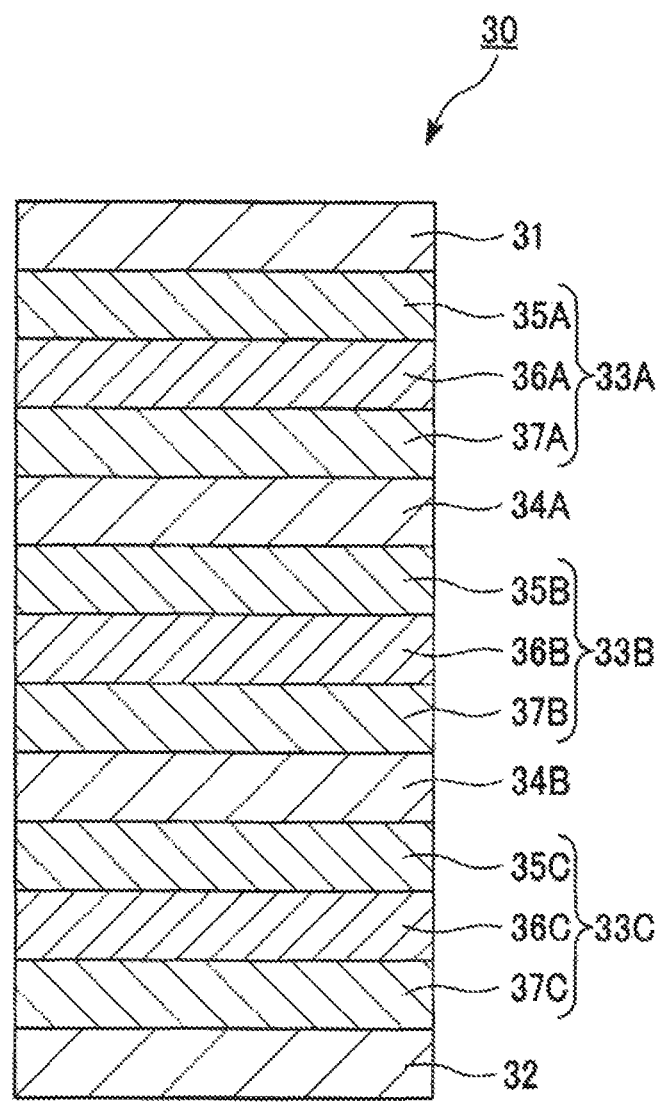
FIG. 3 is a cross-sectional view illustrating a schematic configuration of an organic EL element according to a third embodiment of the present invention.

FIG. 3 is a cross-sectional view illustrating a schematic configuration of an organic EL element according to a third embodiment of the present invention.

As illustrated in FIG. 3, the organic EL element 30 of the embodiment has a structure in which multiple light emitting units 33A, 33B, 33C each including a light emitting layer made of at least an organic compound are stacked one on top of another between a first electrode 31 and a second electrode 32 with each of charge generating layers (CGL) 34A, 34B sandwiched between a corresponding pair of the adjacent light emitting units. The organic EL element 30 is an organic EL element capable of providing yellow or orange light by causing the multiple light emitting units 33A, 33B, 33C to emit light.

The organic EL element 30 of the embodiment includes the first light emitting unit 33A, the second light emitting unit 33B, and the third light emitting unit 33C.

The first light emitting unit 33A is a red light emitting unit. The second light emitting unit 33B is a green light emitting unit. The third light emitting unit 33C is a red light emitting unit.

The red light emitting units each include a light emitting layer formed of a red light emitting layer which emits red light with one peak wavelength in a red wavelength band. The red light provided by the red light emitting unit including the light emitting layer formed of the red light emitting layer may include a delayed fluorescence component. Moreover, the green light emitting unit includes a light emitting layer formed of a green light emitting layer which emits green light with one or two peak wavelengths in a green wavelength band. The green light provided by the green light emitting unit including the light emitting layer formed of the green light emitting layer may include a delayed fluorescence component.

The first light emitting unit 33A and the second light emitting unit 33B are stacked one on top of the other with the first charge generating layer 34A sandwiched therebetween. The second light emitting unit 33B and the third light emitting unit 33C are stacked one on top of the other with the second charge generating layer 34B sandwiched therebetween.

The organic EL element 30 of the embodiment has a structure in which the second electrode 32, the third light emitting unit 33C, the second charge generating layer 34B, the second light emitting unit 33B, the first charge generating layer 34A, the first light emitting unit 33A, and the first electrode 31 are stacked one on top of another in this order. Specifically, the organic EL element 30 of the embodiment has an MPE structure in which the first light emitting unit 33A, the second light emitting unit 33B, and the third light emitting unit 33C are stacked one on top of another with each of the first charge generating layer 34A and the second charge generating layer 34B, sandwiched between the corresponding pair of adjacent light emitting units.

In the organic EL element 30 of the embodiment, the yellow or orange light produced by the light emission of the first light emitting unit 33A, the second light emitting unit 33B, and the third light emitting unit 33C has one peak wavelength in a red wavelength band of 590 nm to 640 nm and one or two peak wavelengths in a green wavelength band of 500 nm to 560 nm.

In the organic EL element 30 of the embodiment, a difference between a peak wavelength of the yellow or orange light and a dominant wavelength of the yellow or orange light is 15 nm to 25 nm.

When the difference between the peak wavelength of the yellow or orange light and the dominant wavelength of the yellow or orange light is 15 nm to 25 nm, the organic EL element 30 can efficiently provide the color light (red light) of the first light emitting unit 13A, the color light (green light) of the second light emitting unit 33B, and the color light (red light) of the third light emitting unit 33C. Accordingly, the organic EL element 30 can provide color light suitable as illumination light with high luminous efficiency. Moreover, the external quantum efficiency of the organic EL element 30 is improved.

When the difference between the peak wavelength of the yellow or orange light and the dominant wavelength of the yellow or orange light is less than 15 nm, a peak wavelength not included in an original light emission component (red light component or green light component) is emphasized by an interference effect and the luminous efficiency decreases. Meanwhile, when the difference between the peak wavelength of the yellow or orange light and the dominant wavelength of the yellow or orange light is greater than 25 nm, the red light and the green light which are main components of the color light cannot be provided in a sufficient intensity and the color light thus has poor color as illumination light.

The same electrode as the first electrode 11 in the aforementioned first embodiment can be used as the first electrode 31.

The same electrode as the second electrode 12 in the aforementioned first embodiment can be used as the second electrode 32.

The first red light emitting unit 33A is formed of a first electron transport layer 35A, a first red light emitting layer 36A, and a first hole transport layer 37A. The second red light emitting unit 33B is formed of a second electron transport layer 35B, a second red light emitting layer 36B, and a second hole transport layer 37B. The third red light emitting unit 33C is formed of a third electron transport layer 35C, a third red light emitting layer 36C, and a third hole transport layer 37C.

As the first light emitting unit 33A, the same unit as the first light emitting unit 13A in the aforementioned first embodiment can be used.

As the second light emitting unit 33B, the same unit as the second light emitting unit 13B in the aforementioned first embodiment can be used.

As the third light emitting unit 33C, the same unit as the first light emitting unit 13A in the aforementioned first embodiment can be used.

The first electron transport layer 35A, the second electron transport layer 35B, and the third electron transport layer 35C each have the same configuration as that of the electron transport layer 14 in the aforementioned first embodiment.

The first hole transport layer 37A, the hole transport layer 37B, and the hole transport layer 37C each have the same configuration as that of the hole transport layer 16 in the aforementioned first embodiment.

As the first charge generating layer 34A and the second charge generating layer 34B, the same layer as the charge generating layer 14 in the aforementioned first embodiment can be used.

As described above, in the organic EL element 30 of the embodiment, since the difference between the peak wavelength of the yellow or orange light and the dominant wavelength of the yellow or orange light is 15 nm to 25 nm, the organic EL element 30 can provide the yellow or orange light with high luminous efficiency. Moreover, the organic EL element 30 of the embodiment has the MPE structure in which the first light emitting unit 33A, the second light emitting unit 33B, and the third light emitting unit 33C are stacked one on top of another with each of the first charge generating layer 34A and the second charge generating layer 34B sandwiched between the corresponding pair of adjacent light emitting units. Accordingly, the organic EL element 30 can provide orange light while achieving high-luminance light emission and long-life driving.

The organic EL element 30 of the embodiment can be thereby preferably used in a special lighting device such as an automobile lighting device.

Fourth Embodiment

"Lighting Device"

An embodiment of the lighting device in the present invention is described.

Figure 4:
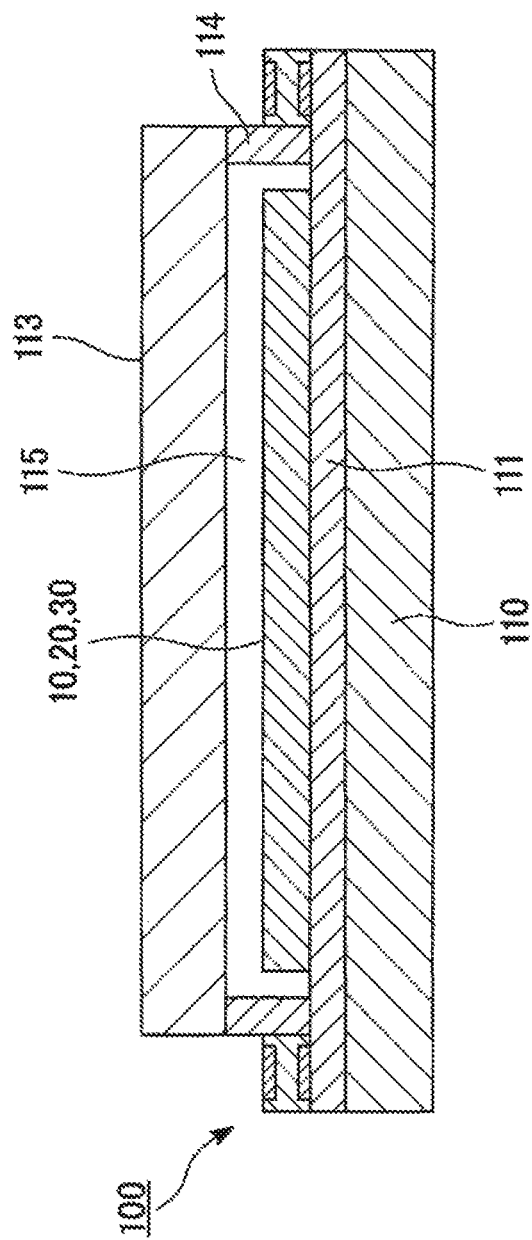
FIG. 4 is a cross-sectional view illustrating a schematic configuration of an embodiment of a lighting device of the present invention.

FIG. 4 is a cross-sectional view illustrating a configuration of an embodiment of the lighting device in the present invention. Although an example of the lighting device to which the present invention is applied is described herein, the lighting device of the present invention is not necessarily limited to such a configuration and various changes can be made as appropriate.

The lighting device 100 of the embodiment includes, for example, any one of the organic EL elements 10, 20, 30 as a light source.

As illustrated in FIG. 4, in the lighting device 100 of the embodiment, multiple anode terminal electrodes 111 and cathode terminal electrodes (illustration omitted) are formed at sides or vertices of a periphery of a glass substrate 110 so that the organic EL element 10, 20, 30 can uniformly emit light. Note that the entire surfaces of the anode terminal electrodes 111 and the entire surfaces of the cathode terminal electrodes are covered with solder (underlying solder) to reduce wiring resistance. Moreover, the anode terminal electrodes 111 and the cathode terminal electrodes uniformly supply an electric current to the organic EL element 10, 20, 30 from the sides or vertices of the periphery of the glass substrate 110. For example, in order to uniformly supply an electric current to the organic EL element 10, 20, 30 formed in a quadrilateral shape, the lighting device 100 includes the anode terminal electrodes 111 on the sides and the cathode terminal electrodes at the vertices. Alternatively, for example, the lighting device 100 includes the anode terminal electrodes 111 on peripheries of L-shaped portions each including a vertex and extending over two sides and the cathode terminal electrodes in center portions of the respective sides.

Moreover, a sealing substrate 113 is arranged on the glass substrate 110 to cover the organic EL element 10, 20, 30 to prevent degrading of the performance of the organic EL element 10, 20, 30 due to oxygen, water, and the like. The sealing substrate 113 is provided on the glass substrate 110 with a peripheral sealing member 114 therebetween. A small gap 115 is provided between the sealing substrate 113 and the organic EL element 10, 20, 30. This gap 115 is filled with a hygroscopic agent. The gap 115 may be filled with, for example, an inert gas such as nitrogen, silicone oil, or the like instead of the hygroscopic agent. Moreover, the gap 115 may be filled with a gel resin in which the hygroscopic agent is dispersed.

Note that, although the glass substrate 110 is used as a base substrate for forming the element in the embodiment, a substrate made of a material such as plastic, metal, or ceramic may also be used. Moreover, in the embodiment, a glass substrate, a plastic substrate, or the like can be used as the sealing substrate 113. When plastic substrates are used as the base substrate and the sealing substrate, the lighting device 100 of the embodiment is flexible.

Moreover, a UV curable resin or a thermal setting resin with low oxygen permeability and low water permeability, a laser glass frit, or the like can be used for the sealing member 114.

The lighting device of the embodiment may have a configuration including an optical film for improving the luminous efficiency, on the light extraction surface side of the organic EL element 10, 20, 30 in the aforementioned embodiment.

The optical film used in the lighting device of the embodiment is provided to improve the luminous efficiency while maintaining the color rendering property.

An organic EL element emits light in a light emitting layer with a higher refractive index (refractive index of about 1.6 to 2.1) than air and it is generally said that only about 15% to 20% of light emitted from the light emitting layer can be extracted. This is because light incident on an interface at an angle equal to or greater than a critical angle is totally reflected and cannot be extracted to the outside of the element. Specifically, light is totally reflected between a transparent substrate and a transparent electrode or the light emitting layer to be guided through the transparent electrode or the light emitting layer and resultantly escapes in directions toward side surfaces of the element.

As a method for improving the extraction efficiency of the light, there are, for example, the following methods: a method of making a surface of the transparent substrate rough to prevent total reflection on an interface between the transparent substrate and air (see, for example, "U.S. Pat. No. 4,774,435"); a method of providing the substrate with a light condensing property to improve the efficiency (see, for example, "Japanese Patent Application Publication No. Sho 63-314795"); a method of forming reflection surfaces on the side surfaces of the element and the like (see, for example, "Japanese Patent Application Publication No. Hei 1-220394"); a method of introducing a flat layer with an intermediate refractive index between the substrate and the light emitting body to form a reflection prevention film (see, for example, "Japanese Patent Application Publication No. Sho 62-172691"); a method of introducing a flat layer with a lower refractive index than the substrate, between the substrate and the light emitting body (see, for example, "Japanese Patent Application Publication No. 2001-202827"); a method of forming a diffraction grading between any two of the substrate, the transparent electrode layer, and the light emitting layer (including between the substrate and the outside) (see, for example, "Japanese Patent Application Publication No. Hei 11-283751"); and the like.

Note that, in order to improve the aforementioned color rendering property, the lighting device 100 may have a structure in which a microlens array or the like is further provided on a surface of the aforementioned optical film or may be combined with a light condensing sheet. This allows the light to be condensed in a specific direction, for example, a direction frontward of the element light emitting surface, thereby improving the luminance in the specific direction. Furthermore, a light diffusion film may be used together with the light condensing sheet to control a light emission angle from the organic EL element. For example, a light diffusion film (LIGHT-UP) manufactured by Kimoto Co., Ltd. or the like can be used as the light diffusion film.

Note that the present invention is not necessarily limited to the aforementioned embodiment and various changes can be made within a scope not departing from the spirit of the present invention.

Specifically, in the present invention, the aforementioned organic EL elements 10, 20, 30 capable of providing the yellow or orange light can be preferably used as, for example, a light source of the special lighting device 100 such as the automobile lighting device.

EXAMPLES

Effects of the present invention are made clearer below by using Experimental Examples.

Note that the present invention is not limited to following Experimental Examples and changes can be made as appropriate within a scope not departing from the spirit of the invention.

Experimental Example 1

"Manufacturing of Organic EL Element"

In Experimental Example 1, an organic EL element having an element structure illustrated in Table 1 was manufactured.

Specifically, first, there was prepared a soda-lime glass substrate with a thickness of 0.7 mm on which an ITO film with a thickness of 100 nm, a width of 2 mm, and a sheet resistance of about 20Ω/□ was formed.

Then, the substrate was subjected to ultrasonic cleaning by using neutral detergent, ion-exchanged water, acetone, and isopropyl alcohol for 5 minutes for each cleaner and then subjected to spin drying and $UV/O_3$ treatment.

Next, vapor deposition crucibles (made of tantalum or alumina) in a vacuum deposition apparatus were filled respectively with materials used to form layers illustrated in Table 1. Then, the substrate was set in the vacuum deposition apparatus, electric power was supplied to the vapor deposition crucibles to heat them in a reduced pressure atmosphere with a degree of vacuum of $1 \times 10^{-4}$ Pa or less, and each of the layers was vapor-deposited to a predetermined film thickness at a deposition rate of 0.1 nm per second.

Moreover, the cathode was vapor-deposited to a predetermined film thickness at a deposition rate of 1 nm per second.

In the organic EL element of Experimental Example 1, the first light emitting layer is the green light emitting layer and the second light emitting layer is the red light emitting layer.

"Evaluation of Organic EL Element"

The organic EL element of Experimental Example 1 manufactured as described above was connected to a measurement unit driver (trade name: KEITHLEY 2425, manufactured by Keithley Instruments, LLC) and power with a constant current of 3 $mA/cm^2$ was supplied to the organic EL element to cause it to emit light in an integrating sphere.

Then, the emission spectrum and the luminous flux value of the organic EL element were measured by using a multi-channel spectrometer (trade name: USB2000, manufactured by Ocean Optics, Inc.). Moreover, the external quantum efficiency (%) of the organic EL element of Experimental Example 1 was calculated based on the result of this measurement. Results are depicted in Table 2. Furthermore, the difference (nm) between the peak wavelength (A) of the orange light and the dominant wavelength (B) of the orange light was calculated from the emission spectrum of the organic EL element. Results are depicted in Table 2.

Figure 5:
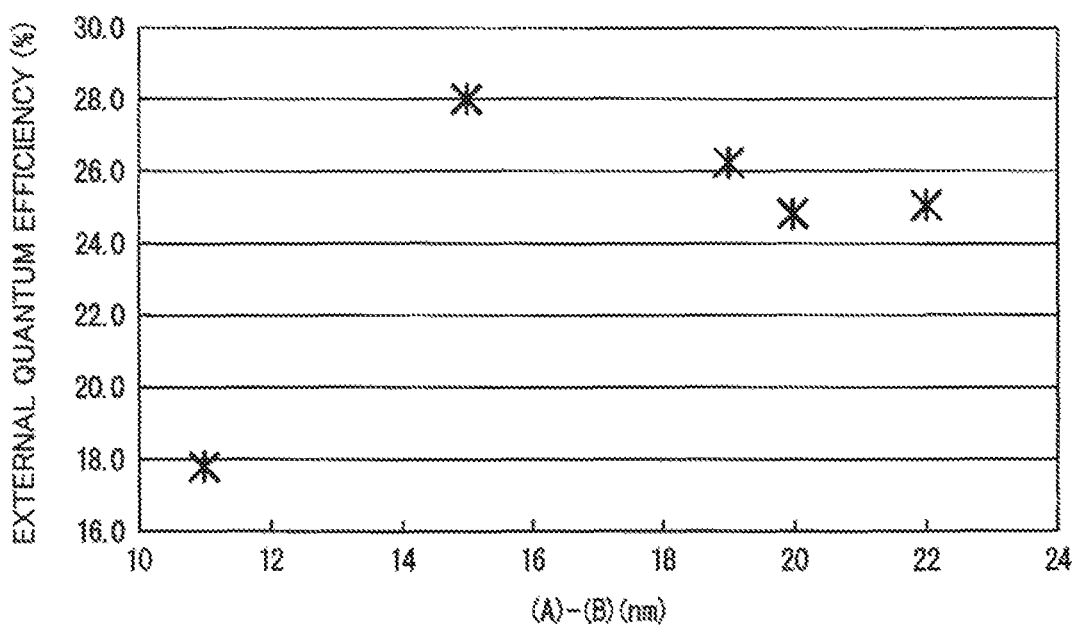
FIG. 5 is a graph depicting relationships between an external quantum efficiency and a difference between a peak wavelength (A) of orange light and a dominant wavelength (B) of the orange light in each of organic EL elements of Experimental Examples 1 to 5.
Figure 6:
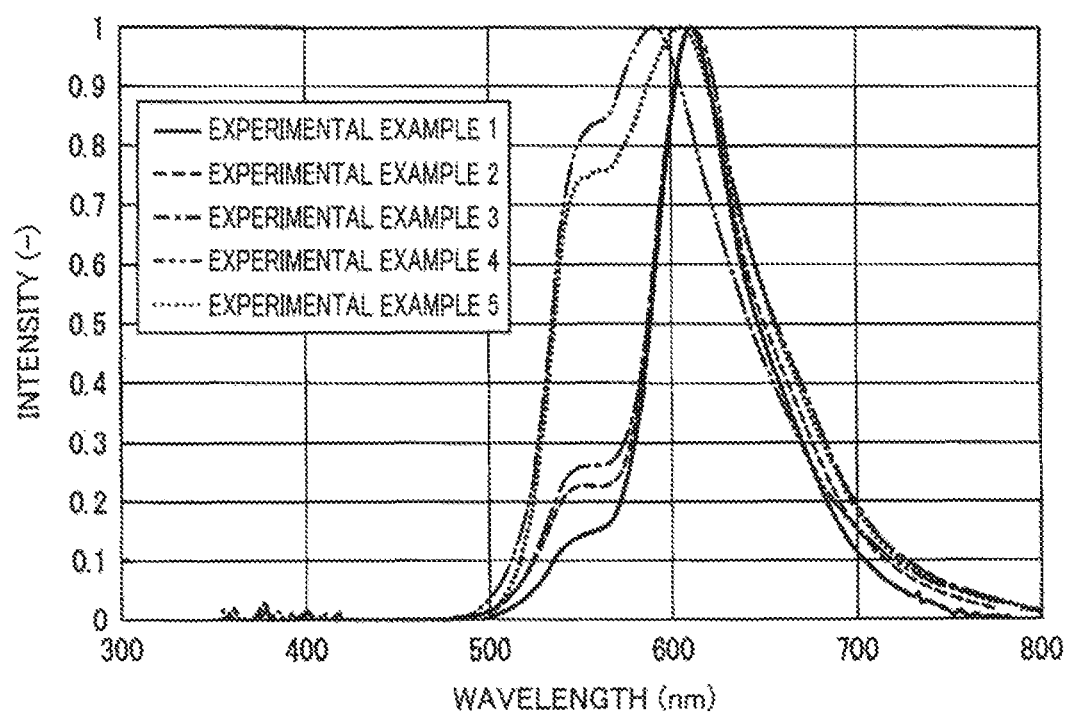
FIG. 6 is a graph depicting emission spectra of the organic EL elements of Experimental Examples 1 to 5.

FIG. 5 depicts relationships between the external quantum efficiency (%) and the difference (nm) between the peak wavelength (A) of the orange light and the dominant wavelength (B) of the orange light. Moreover, FIG. 6 depicts emission spectra of the organic EL elements.

Experimental Example 2

An organic EL element of Experimental Example 2 having an element structure depicted in Table 1 was manufactured by using the same manufacturing method as in Experimental Example 1.

In the organic EL element of Experimental Example 2, the first light emitting layer is a green light emitting layer and the second light emitting layer is a red light emitting layer.

Then, the organic EL element of Experimental Example 2 was evaluated in the same methods as in Experimental Example 1. The results of the evaluations are depicted in Table 2 and FIGS. 5 and 6.

Experimental Example 3

An organic EL element of Experimental Example 3 having an element structure depicted in Table 1 was manufactured by using the same manufacturing method as in Experimental Example 1.

In the organic EL element of Experimental Example 3, the first light emitting layer is a green light emitting layer and the second light emitting layer is a red light emitting layer.

Then, the organic EL element of Experimental Example 3 was evaluated in the same methods as in Experimental Example 1. The results of the evaluations are depicted in Table 2 and FIGS. 5 and 6.

Experimental Example 4

An organic EL element of Experimental Example 4 having an element structure depicted in Table 1 was manufactured by using the same manufacturing method as in Experimental Example 1.

In the organic EL element of Experimental Example 4, the first light emitting layer is a red light emitting layer and the second light emitting layer is a green light emitting layer.

Then, the organic EL element of Experimental Example 4 was evaluated in the same methods as in Experimental Example 1. The results of the evaluations are depicted in Table 2 and FIGS. 5 and 6.

Experimental Example 5

An organic EL element of Experimental Example 5 having an element structure depicted in Table 1 was manufactured by using the same manufacturing method as in Experimental Example 5.

In the organic EL element of Experimental Example 4, the first light emitting layer is a red light emitting layer and the second light emitting layer is a green light emitting layer.

Then, the organic EL element of Experimental Example 5 was evaluated in the same methods as in Experimental Example 1. The results of the evaluations are depicted in Table 2 and FIGS. 5 and 6.

TABLE 1

|  | Experimental Example 1 | Experimental Example 2 | Experimental Example 3 | Experimental Example 4 | Experimental Example 5 |
|---|---|---|---|---|---|
| First electrode | 100 nm | 100 nm | 100 nm | 100 nm | 100 nm |
| First electron transport layer | 123 nm | 123 nm | 123 nm | 128 nm | 138 nm |
| First light emitting layer | 35 nm | 35 nm | 35 nm | 30 nm | 30 nm |
| First hole transport layer | 75 nm | 75 nm | 100 nm | 45 nm | 60 nm |
| Charge generating layer | 14 nm | 14 nm | 14 nm | 14 nm | 14 nm |
| Second electron transport layer | 10 nm | 10 nm | 10 nm | 10 nm | 10 nm |
| Second light emitting layer | 30 nm | 30 nm | 30 nm | 35 nm | 35 nm |
| Second hole transport layer | 100 nm | 100 nm | 100 nm | 100 nm | 100 nm |
| Second electrode | 100 nm | 100 nm | 100 nm | 100 nm | 100 nm |

TABLE 2

|  | Peak wavelength (A) [nm] | Dominant wavelength (B) [nm] | (A) − (B) [nm] | External quantum efficiency [%] |
|---|---|---|---|---|
| Experimental Example 1 | 610 | 595 | 15 | 28.0 |
| Experimental Example 2 | 611 | 592 | 19 | 26.2 |
| Experimental Example 3 | 612 | 592 | 20 | 24.8 |
| Experimental Example 4 | 590 | 579 | 11 | 17.8 |
| Experimental Example 5 | 604 | 582 | 22 | 25.0 |

From the results of Table 2 and FIGS. 5 and 6, it was found that, when (A)–(B) is less than 15 nm, the peak wavelength of the red light becomes shorter than the original emission wavelength of the red light emitting material or the peak wavelength of the green light becomes longer than the original emission wavelength of the green light emitting material. Specifically, in the emission spectrum of the organic EL element of Experimental Example 4 depicted in FIG. 5, the peak wavelength of the red light is 590 nm due to the interference effect and is 20 nm shorter than the original peak wavelength of the red light which is 610 nm. In such a case, the peak wavelength not included in the original light emission component is emphasized by the interference effect and the luminous efficiency of the organic EL element decreases.

It was found that, when (A)-(B) is 15 nm to 25 nm, the peak wavelengths of the red light were 610 nm, 611 nm, and 612 nm, respectively, in the emission spectra of the organic EL elements of Experimental Examples 1 to 3 and were equivalent to the original emission wavelength which is 610 nm. It was found from the emission spectra of the organic EL elements of Experimental Examples 1 to 3 depicted in FIG. 6 that the red light was efficiently emitted. Moreover, it was found that, in Experimental Examples 2 and 3 in which the green emission intensity is higher than that in Experimental Example 1, although the wavelength difference (A)-(B) gradually increased due to a decrease in the dominant wavelength, orange light suitable for illumination light was emitted by efficient emission of both of the red light and the green light.

Moreover, it was found that the organic EL element of Experimental Example 5 had a higher emission intensity of the green light than the organic EL elements of Experimental Examples 1 to 3 and could thereby efficiently emit yellow light.

It is presumed that, when (A)-(B) is greater than 25 nm, the peak wavelength of the green light becomes shorter than the original emission wavelength due to the interference effect or the emission intensity of the red light is low and the emission of the green light is dominant. In either case, the red light which is the main component of the color light cannot be provided in a sufficient intensity and the color light thus has poor color as illumination light and is not suitable as illumination light.

Accordingly, light of both emission colors of red light and green light can be efficiently provided by setting (A)-(B) within a range of 15 nm to 25 nm, and light of excellent emission color suitable as illumination light can be provided while achieving highly-efficient light emission.

INDUSTRIAL APPLICABILITY

According to one aspect of the present invention, it is possible to provide an organic electroluminescent element which emits color light other than white light with high luminous efficiency and which is suitable for a special lighting device such as an automobile lighting device and to provide a lighting device including this organic electroluminescent element.

DESCRIPTION OF REFERENCE NUMERALS 10, 20, 30 organic EL element
11, 21, 31 first electrode
12, 22, 32 second electrode
13A, 23A, 33A first light emitting unit
13B, 23B, 33B second light emitting unit
14, 24 charge generating layer
15A, 25A, 35A first electron transport layer
15B, 25B, 35B second electron transport layer
16A, 26A, 36A first light emitting layer
16B, 26B, 36B second light emitting layer
17A, 27A, 37A first hole transport layer
17B, 27B, 37B second hole transport layer
33C third light emitting unit
34A first charge generating layer
34B second charge generating layer
35C third electron transport layer
36C third light emitting layer
37C third hole transport layer
100 lighting device
111 anode terminal electrode
113 sealing substrate
114 sealing member
115 gap

The invention claimed is:

1. An organic electroluminescent element having a structure in which a plurality of light emitting units each including a light emitting layer made of at least an organic compound are stacked one on top of another between a first electrode and a second electrode with a charge generating layer sandwiched between the light emitting units, the organic electroluminescent element comprising:
a red light emitting unit including a light emitting layer formed of a red light emitting layer which emits red light with a peak wavelength in a red wavelength band; and
a green light emitting unit including a light emitting layer formed of a green light emitting layer which emits green light with a peak wavelength in a green wavelength band, wherein
yellow or orange light produced by light emission of the red light emitting unit and the green light emitting unit has a peak wavelength in a red wavelength band of 590 nm to 640 nm and a peak wavelength in a green wavelength band of 500 nm to 560 nm, and
a difference between the peak wavelength of the yellow or orange light and a dominant wavelength of the yellow or orange light is 15 nm to 25 nm.

2. The organic electroluminescent element according to claim 1, wherein
the red light emitting layer has one peak wavelength in the red wavelength band,
the green light emitting layer has one or two peak wavelengths in the green wavelength band, and
the yellow or orange light produced by the light emission of the red light emitting unit and the green light emitting unit has one peak wavelength in the red wavelength band of 590 nm to 640 nm and has one or two peak wavelength in the green wavelength band of 500 nm to 560 nm.

3. The organic electroluminescent element according to claim 1, wherein the red light emitting layer is formed of a red light emitting layer containing a red fluorescent material or a red phosphorescent material.

4. The organic electroluminescent element according to claim 3, wherein the red light provided by the light emitting unit including the red light emitting layer includes a delayed fluorescence component.

5. The organic electroluminescent element according to claim 1, wherein the green light emitting layer is formed of a green light emitting layer containing a green fluorescent material or a green phosphorescent material.

6. The organic electroluminescent element according to claim 5, wherein the green light provided by the light emitting unit including the green light emitting layer includes a delayed fluorescence component.

7. The organic electroluminescent element according to claim 1, the organic electroluminescent element capable of providing yellow or orange light by causing the plurality of light emitting units to emit light, the organic electroluminescent element comprising:
a first light emitting unit formed of the red light emitting unit; and
a second light emitting unit formed of the green light emitting unit, wherein the first light emitting unit and the second light emitting unit are stacked one on top of the other with a first charge generating layer sandwiched therebetween, and the organic electroluminescent element has a structure in which the second electrode, the second light emitting unit, the first charge generating layer, the first light emitting unit, and the first electrode are stacked one on top of another in this order.

8. The organic electroluminescent element according to claim 1, the organic electroluminescent element capable of providing yellow or orange light by causing the plurality of light emitting units to emit light, the organic electroluminescent element comprising:
a first light emitting unit formed of the green light emitting unit; and
a second light emitting unit formed of the red light emitting unit, wherein
the first light emitting unit and the second light emitting unit are stacked one on top of the other with a first charge generating layer sandwiched therebetween, and
the organic electroluminescent element has a structure in which the second electrode, the second light emitting unit, the first charge generating layer, the first light emitting unit, and the first electrode are stacked one on top of another in this order.

9. The organic electroluminescent element according to claim 1, the organic electroluminescent element capable of providing yellow or orange light by causing the plurality of light emitting units to emit light, the organic electroluminescent element comprising:
a first light emitting unit formed of the red light emitting unit;
a second light emitting unit formed of the green light emitting unit; and
a third light emitting unit formed of the red light emitting unit, wherein
the first light emitting unit and the second light emitting unit are stacked one on top of the other with a first charge generating layer sandwiched therebetween,
the second light emitting unit and the third light emitting unit are stacked one on top of the other with a second charge generating layer sandwiched therebetween, and
the organic electroluminescent element has a structure in which the second electrode, the third light emitting unit, the second charge generating layer, the second light emitting unit, the first charge generating layer, the first light emitting unit, and the first electrode are stacked one on top of another in this order.

10. The organic electroluminescent element according to claim 1, wherein
the charge generating layer is formed of an electrically insulating layer made of an electron accepting material and an electron donating material, and
a specific resistance of the electrically insulating layer is $1.0 \times 10^2 \Omega \cdot cm$ or more.

11. The organic electroluminescent element according to claim 10, wherein the specific resistance of the electrically insulating layer is $1.0 \times 10^5 \Omega \cdot cm$ or more.

12. The organic electroluminescent element according to claim 1, characterized in that
the charge generating layer is formed of a mixed layer of different materials and one component of the mixed layer forms a charge transfer complex by redox, and
when voltage is applied between the first electrode and the second electrode, charges in the charge transfer complex move to the first electrode side and the second electrode side to cause holes to be injected into one light emitting unit located on the first electrode side of the charge generating layer and cause electrons to be injected into another light emitting unit located on the second electrode side of the charge generating layer.

13. The organic electroluminescent element according to claim 1, characterized in that
the charge generating layer is formed of a laminate of an electron accepting material and an electron donating material, and
when voltage is applied between the first electrode and the second electrode, in an interface between the electron accepting material and the electron donating material, charges generated by reaction involving electron transfer between the electron accepting material and the electron donating material move to the first electrode side and the second electrode side to cause holes to be injected into one light emitting unit located on the first electrode side of the charge generating layer and cause electrons to be injected into another light emitting unit located on the second electrode side of the charge generating layer.

14. The organic electroluminescent element according to claim 1, wherein the charge generating layer contains a compound having a structure expressed by formula (1):

[Chem. 1]

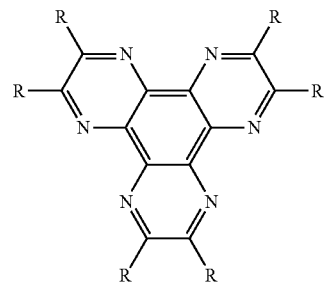

(1)

where R represents an electron withdrawing group of F, Cl, Br, I, CN, or $CF_3$.

15. A lighting device comprising the organic electroluminescent element according to claim 1.

16. The lighting device according to claim 15, comprising an optical film on a light extraction surface side of the organic electroluminescent element.

17. The lighting device according to claim 15, comprising a base substrate and a sealing substrate which are formed of flexible substrates, wherein
the lighting device is flexible.

* * * * *